United States Patent [19]

Naguib et al.

[11] 4,203,119
[45] May 13, 1980

[54] THERMAL PRINTERS

[75] Inventors: Hussein M. Naguib; David R. Baraff, both of Ottawa; Steven Kos, Hazeldean, all of Canada

[73] Assignee: Northern Telecom Limited, Montreal, Canada

[21] Appl. No.: 939,385

[22] Filed: Sep. 5, 1978

[51] Int. Cl.² .................. G01D 15/10; H05B 1/00
[52] U.S. Cl. .................. 346/76 PH; 219/216
[58] Field of Search .................. 346/76 PH; 219/216

[56] References Cited

U.S. PATENT DOCUMENTS

| 3,542,697 | 11/1970 | Chamberland et al. | |
| 3,599,228 | 8/1971 | Coco et al. | 346/76 PH |
| 3,953,708 | 4/1976 | Thornburg | 346/76 PH X |
| 4,091,391 | 5/1978 | Kozima et al. | 346/76 PH |
| 4,113,391 | 9/1978 | Minowa | 346/76 PH X |

Primary Examiner—George H. Miller, Jr.
Attorney, Agent, or Firm—Sidney T. Jelly

[57] ABSTRACT

Each thick film resistive print element of a thermal print bar operated in a scan mode is series connected to a thick film switch which sets a voltage threshold to isolate the element from periodic scan pulses unless coincident with an element selecting data pulse in which case the thick film undergoes joule heating which causes it to switch and its series-connected resistive element undegoes joule heating.

3 Claims, 2 Drawing Figures

THERMAL PRINTERS

This invention relates to thermal print bars for use, for example in facsimile systems.

In a known type of facsimile system, a thermal print bar is moved relative to a receptor of heat sensitive paper. A surface of the print bar is caused to undergo localized heating in response to an incoming facsimile signal so that an array of pels, or darkened areas, appearing on the heat sensitive paper accurately resembles pictorial or other information contained in the facsimile signal.

A previously proposed form of thermal print bar utilizes an array of elements of resistive material, each element being addressed by a selected pair of control electrodes. The electrodes to the thermal print bar are divided in a regular cartesian arrangement, into scan electrodes and data electrodes. Scan voltage pulses are applied regularly to successive scan electrodes while data pulses appropriate to an incoming facsimile or like signal are applied to appropriate ones of the data electrodes. The data pulses may be positive $-V_D$ or negative $-V_D$ whereas the scan pulses are arranged to be single valued, say $v_s$. Thus when the potential difference across an element of resistive material is a maximum $V_D + v_s$, the element should undergo sufficient joule heating that it darkens heat sensitive paper whereas when the potential difference is a minimum, $v_s - V_D$, the resistive element should undergo insufficient heating for adjacent heat sensitive material to be effected.

The use of a scan system does introduce a problem. Because of the rate at which the scan pulses are applied, the elements respond to the r.m.s. of the applied voltage $v_s$, so elements although not selected for data printing, receive a voltage higher than $v_s - V_D$ and consequently exhibit a measure of joule heating with consequent ghosting of the heat sensitive paper. This wastes power and can reduce contrast between printed and non-printed parts of a receptor sheet of heat sensitive paper.

The use of discrete diodes in the addressing circuitry has been proposed to overcome the problem. In addition to being expensive, diodes limit the power which can be applied to the resistive heating elements and create reliability problems due to the large number of components needed to be bonded to each substrate.

According to the invention there is provided a thermal printer for printing on a heat-sensitive receptor, the printer comprising: an array of thick film resistive printing elements series-connected to each resistive print element, a respective switching element, each switching element comprising a thick film deposit incorporating vanadium dioxide, the material undergoing a marked resistivity change at a predetermined temperature owing to a change in crystalline structure of said vanadium dioxide; and addressing circuitry for selectively apply a potential difference across a combination of a printing element and its series-connected switching element thereby to cause joule heating of said switching element to promote a reduction in the material resistivity whereupon the series-connected resistive printing element experiences a corresponding increase in potential difference and consequently undergoes joule heating.

An embodiment of the invention will now be described by way of example with reference to the accompanying drawings in which.

Figure 1:
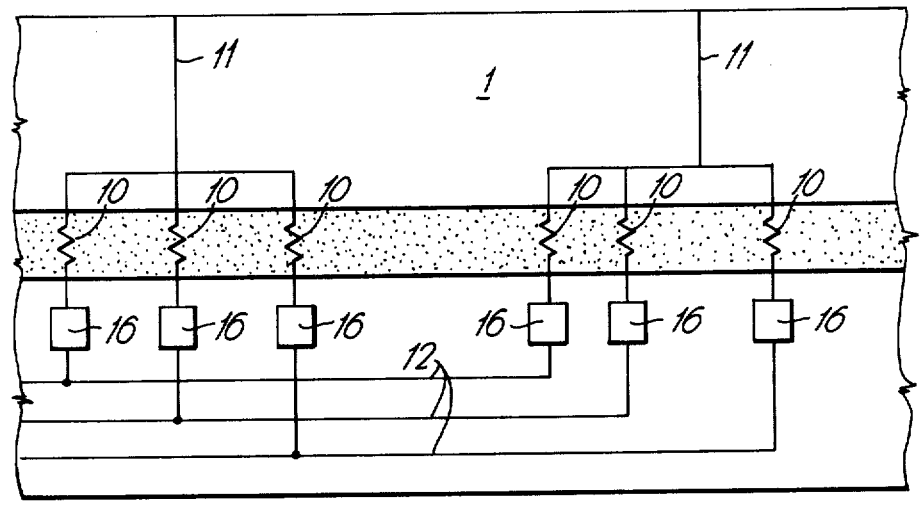
FIG. 1 shows part-schematically a portion of a thermal print bar.

Referring specifically to FIG. 1, a number of heating resistor elements 10 are connected into a matrix of column and row electrodes, respectively 11 and 12. The large number of the elements, connected into the electrode matrix in a linear disposition, is used as a thermal print bar, for example, in facsimile systems. In operation, one component of a facsimile signal is applied successively to column electrodes 11 while other components of the facsimile signal are applied to appropriate ones of the row electrodes 12. According to the total potential difference produced across a resistor element, the element undergoes joule heating and a heat-sensitive receptor sheet drawn across the thermal print bar is printed accordingly. A scanning pulse is applied cyclically to the electrodes 11 which are termed the scan electrodes, the applied scanning pulses being of fixed amplitude and sense. On the other hand, the electrodes 12, termed the data electrodes, receive, as appropriate, a data pulse, the timing of the pulse and the selection of electrode corresponding to a pel, or darkened area to be printed, and being derived through pulse generation circuitry (not shown). The data pulse may be positive or negative according to whether the particular element is required to print or not on the heat sensitive paper. If the scan pulse is at $+v_s$ and the data pulse is at $V_D$, then the total potential difference across the resistor element may be $v_s - V_D$ and the cell characteristics are so chosen that insufficient joule heating occurs in an element to materially darken an area of the receptor sheet with which the particular element is in contact. If the data pulse is at $-V_D$ then the total potential difference is $v_s + V_D$ and printing on the heat sensitive receptor sheet will occur.

It will be readily appreciated that between the potential differences across the heating resistor of $v_s - V_D$ and $v_s + V_D$ there will be a range of intermediate voltages at which the heating resistors will in fact undergo some heating. Consequently, when the scanning pulse is applied to a scan electrode without a data pulse being applied to a data electrode, there is still some heating of the resistor elements. Because the scan pulses are applied at a very high rate, the heating resistor responds to the r.m.s. of the scan pulse voltage, the effect being that the heating resistor is, throughout use, in a partially "on" state. This is undesirable, firstly, because power is dissipated and secondly because contrast on the receptor sheet will suffer.

Thus, as shown in FIG. 1 between every scan electrode and data electrode there is connected, in series with the resistor element, a heat sensitive thick film switch 16. The switches 16 are printed as films of vanadium dioxide which has been modified as described in U.S. Pat. No. 3,542,697 (Chamberland, et al) to give a transition temperature in the range of 40° C. to 65° C. and a change in electrical resistivity of two to three orders of magnitude. Between the temperatures of 40° C. and 65° C., the resistance of a particular sample of the vanadium dioxide deposited as a thick film resistor, exhibited a change from 42KΩ to 1KΩ.

The thick film switch material may be viewed as having a voltage threshold since when the voltage can generate enough current to produce sufficient joule heating, the switches 16 switch on.

Figure 2:
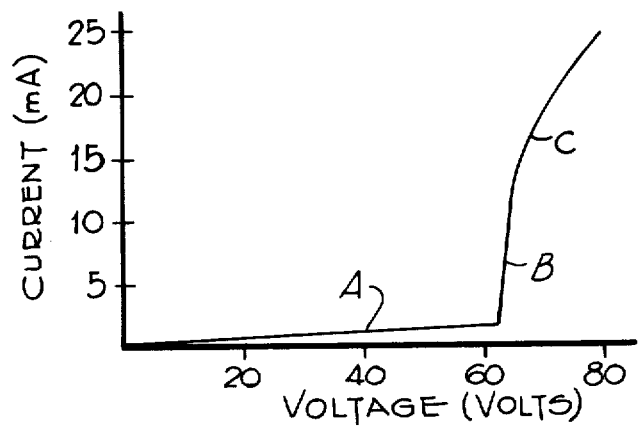
FIG. 2 is a graphical illustration of the current/voltage relationship for a particular pairing of heat sensitive switch and heating resistor used in the print bar.

Referring to the I-V characteristics of a single switch 16 in series with heating resistor 10 for a sample of the modified vanadium dioxide thick film switch, in the region A below 62 V, the I-V curve is essentially linear. In this condition, the switch 16 is off and has a resistance of 42KΩ. Together with the heating resistor, chosen to be 4KΩ, the total resistance is 46KΩ. At about 62 V across the circuit, the switch 16 abruptly turns on as shown at B in FIG. 2 with its resistance falling to 1KΩ leaving a circuit resistance of 5KΩ. Hence the current changes from 1.3 mA below 62 V to 12 mA above 62 volts. In region C the circuit is linear again with a resistance of 5KΩ.

When the thermal printing bar of FIG. 1 is used as part of a thermal printer operating in a scan or "voltage half-select" mode, a typical required printing voltage is 80 V. The corresponding half select voltage is therefore 40 V which is below the switching threshold of the thick film switch 16. Without the switch the half selected resistive element would carry 10 mA. With a switch in the off state, it has been shown to carry 0.9 mA; the current required is lower by a factor of 10. Also the joule heating ($I^2R$) in the half-selected resistor element is lower by a factor of 100. This permits more thorough heating of selected printer elements in the case of resistance inhomogenities in the heating elements 10.

As described in the previously mentioned Chamberland patent, the thick film switch threshold voltage of the vanadium dioxide film may be altered by combining the material with an oxide of one of the metals ruthenium, iridium, rhodium, rhenium, osmium, indium, thallium or arsenic to give a material with formula $(1/2-x)M_xO_4$.

What is claimed is:

1. A thermal printer for printing on a heat-sensitive receptor, the printer comprising:

an array of thick film resistive printing elements and, series-connected to each resistive print element, a respective switching element, each switching element comprising a thick film deposit incorporating vanadium dioxide, the material undergoing a marked resistivity change at a predetermined temperature owing to a change in crystalline structure of said vanadium dioxide; and addressing circuitry for selectively applying a potential difference across a combination of a printing element and its series-connected switching element thereby to cause joule heating of said switching element to promote a reduction in the material resistivity whereupon the series-connected resistive printing element experiences a corresponding increase in potential difference and consequently undergoes joule heating.

2. A thermal print bar as claimed in claim 1, in which said switch material incorporates vanadium dioxide which has been modified in order that the material undergoes said thermally induced semiconductor-to-metal phase transition at a predetermined threshold voltage.

3. A thermal print bar as claimed in claim 1 or 2, in which resistive material is thick film printed as a single elongated strip.

* * * * *